United States Patent
Gattobigio et al.

(10) Patent No.: US 11,143,969 B2
(45) Date of Patent: Oct. 12, 2021

(54) METHOD OF PERFORMANCE TESTING WORKING PARAMETERS OF A FLUID HANDLING STRUCTURE AND A METHOD OF DETECTING LOSS OF IMMERSION LIQUID FROM A FLUID HANDING STRUCTURE IN AN IMMERSION LITHOGRAPHIC APPARATUS

(71) Applicant: ASML NETHERLANDS B.V., Veldhoven (NL)

(72) Inventors: Giovanni Luca Gattobigio, Eindhoven (NL); Nirupam Banerjee, Eindhoven (NL); Johan Franciscus Maria Beckers, Veldhoven (NL); Erik Henricus Egidius Catharina Eummelen, Veldhoven (NL); Ronald Frank Kox, Peer (BE); Theodorus Wilhelmus Polet, Geldrop (NL); Cornelius Maria Rops, Waalre (NL); Mike Paulus Johannes Van Gils, Boxtel (NL); Wouterus Jozephus Johannes Van Sluisveld, Best (NL); Rik Vangheluwe, Bergeijk (NL)

(73) Assignee: ASML Netherlands B.V., Veldhoven (NL)

( * ) Notice: Subject to any disclaimer, the term of this patent is extended or adjusted under 35 U.S.C. 154(b) by 39 days.

(21) Appl. No.: 16/604,324

(22) PCT Filed: Mar. 9, 2018

(86) PCT No.: PCT/EP2018/055872
§ 371 (c)(1),
(2) Date: Oct. 10, 2019

(87) PCT Pub. No.: WO2018/192710
PCT Pub. Date: Oct. 25, 2018

(65) Prior Publication Data
US 2020/0150545 A1    May 14, 2020

(30) Foreign Application Priority Data
Apr. 20, 2017 (EP) .................................... 17167287

(51) Int. Cl.
*G03F 7/20* (2006.01)

(52) U.S. Cl.
CPC ........ *G03F 7/70341* (2013.01); *G03F 7/7065* (2013.01); *G03F 7/70525* (2013.01); *G03F 7/70533* (2013.01)

(58) Field of Classification Search
CPC ............. G03F 7/70341; G03F 7/70525; G03F 7/7065; G03F 7/70533; G03F 7/70925;
(Continued)

(56) References Cited

U.S. PATENT DOCUMENTS

| | | |
|---|---|---|
| 5,229,872 A | 7/1993 | Mumola |
| 5,296,891 A | 3/1994 | Vogt et al. |

(Continued)

FOREIGN PATENT DOCUMENTS

| | | |
|---|---|---|
| CN | 102047182 | 5/2011 |
| EP | 1420298 | 5/2004 |

(Continued)

OTHER PUBLICATIONS

International Search Report and Written Opinion Issue in corresponding PCT Patent Application No. PCT/EP2018/055872, dated Sep. 17, 2018.

(Continued)

*Primary Examiner* — Mesfin T Asfaw
(74) *Attorney, Agent, or Firm* — Pillsbury Winthrop Shaw Pillman LLP

(57) ABSTRACT

A method of performance testing working parameters of a fluid handing structure in an immersion lithographic apparatus, the method including: placing a test substrate having (Continued)

an upper surface with a first portion with a resist defining the upper surface and a second portion with a material different from the resist defining the rest of the upper surface on a table in the immersion lithographic apparatus, confining liquid on a region of an upper surface of the table and/or the upper surface of the test substrate by operating the fluid handing structure using the associated working parameters, moving the table such that the region moves from the second portion to the first portion, and detecting change to and/or residue on the first portion as a result of liquid being left behind on the first portion during the moving.

20 Claims, 6 Drawing Sheets

(58) Field of Classification Search
CPC .. G03F 7/70616; G03F 7/2041; G03F 7/2004; G03F 7/70716; G03F 7/70916; G03F 7/70875; G03F 7/70775; G03F 7/7085; G03F 7/70866; G03F 7/707; G03F 7/70858; G03F 7/70733; G03F 7/70633; G03F 7/70641; G03F 7/70625; G03F 7/70683; G03F 7/705; G03F 7/70516; G03F 7/70483; H01L 21/0274; G03B 27/52

See application file for complete search history.

(56) References Cited

U.S. PATENT DOCUMENTS

| | | |
|---|---|---|
| 5,523,193 A | 6/1996 | Nelson |
| 2004/0207824 A1 | 10/2004 | Lof et al. |
| 2006/0007419 A1 | 1/2006 | Streefkerk et al. |
| 2006/0177777 A1 | 8/2006 | Kawamura et al. |
| 2007/0159609 A1* | 7/2007 | Takaiwa ................ G03F 7/7085 355/53 |
| 2008/0246937 A1 | 10/2008 | Nagasaka |
| 2009/0086175 A1* | 4/2009 | Streefkerk .......... G03F 7/70341 355/30 |
| 2010/0045949 A1 | 2/2010 | Nakano et al. |
| 2010/0245790 A1 | 9/2010 | Seltmann et al. |
| 2011/0261330 A1 | 10/2011 | Ohta et al. |
| 2011/0261345 A1 | 10/2011 | Takaiwa et al. |
| 2013/0135595 A1 | 5/2013 | Streefkerk et al. |

FOREIGN PATENT DOCUMENTS

| | | |
|---|---|---|
| EP | 1783553 | 5/2007 |
| JP | 2007227725 | 9/2007 |

OTHER PUBLICATIONS

"Fluid handling structure qualification test", Research Disclosure, Kenneth Mason Publications, vol. 543, No. 14, Jul. 1, 2009.

Liang, Fu-Jye et al.: "Immersion Defect Reduction (1)—Analysis of Water Leaks in an Immersion Scanner", Proc. of SPIE, vol. 6520, Apr. 17, 2007.

"Thin Film sensor on a Substrate for Immersion Diagnostics", Research Disclosure, Kenneth Mason Publications, vol. 581, No. 53, Sep. 1, 2012.

Nakano, K. et al.: "Immersion defectivity study with volume production immersion lithography tool", Proc. of SPIE, vol. 6520, 2007.

Chinese Office Action Issued in corresponding Chinese Patent Application No. 2018800257144, dated Mar. 3, 2021.

* cited by examiner

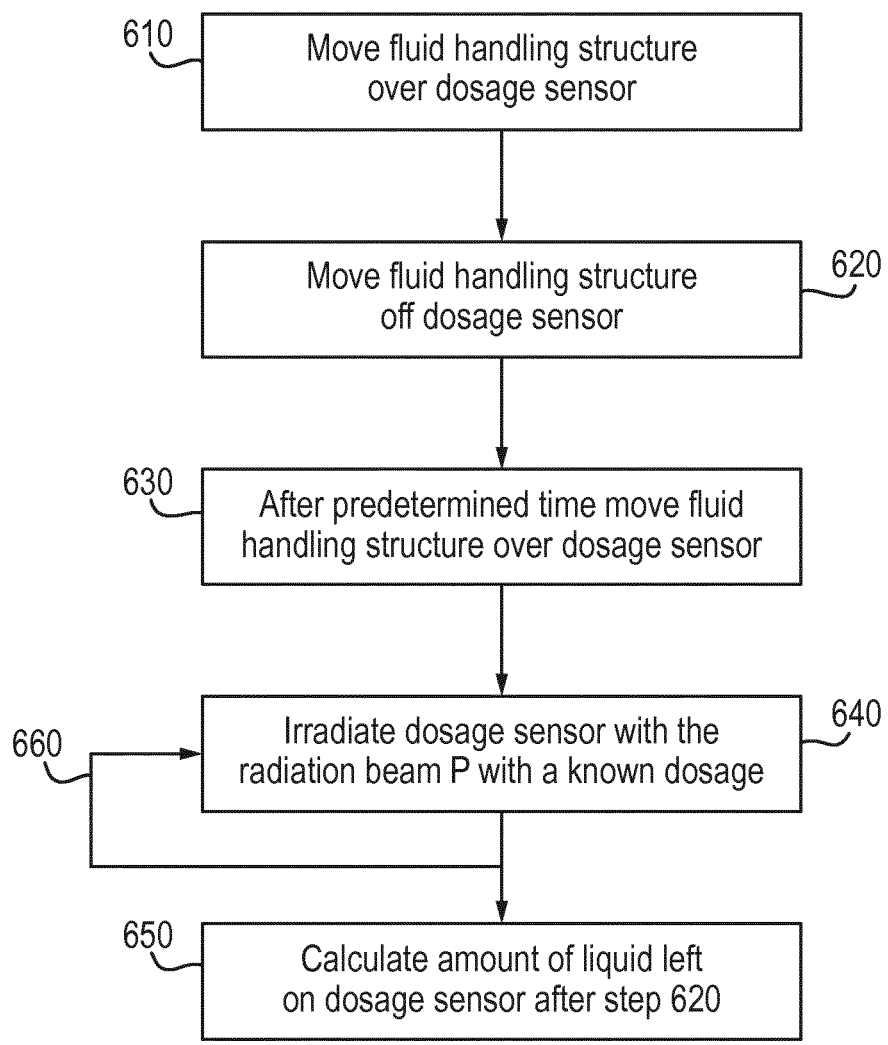

METHOD OF PERFORMANCE TESTING WORKING PARAMETERS OF A FLUID HANDLING STRUCTURE AND A METHOD OF DETECTING LOSS OF IMMERSION LIQUID FROM A FLUID HANDING STRUCTURE IN AN IMMERSION LITHOGRAPHIC APPARATUS

CROSS-REFERENCE TO RELATED APPLICATIONS

This application is the U.S. national phase entry of PCT patent application no. PCT/EP2018/055,872, filed on Mar. 9, 2018, which claims the benefit of priority of European patent application no. 17167287.6, which was filed on Apr. 20, 2017 and which is incorporated herein in its entirety by reference.

FIELD

The present invention relates to a method of performance testing working parameters of a fluid handling structure and a method of detecting loss of immersion liquid from a fluid handing structure in an immersion lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

To project a pattern on the substrate the lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on the substrate than a lithographic apparatus which uses, for example, radiation with a wavelength of 193 nm.

In an immersion lithography apparatus, a liquid is confined to an immersion space by a fluid handling structure (or a liquid confinement structure). The immersion space is between a final optical element of a projection system through which the pattern is imaged and the substrate onto which the pattern is transferred or a support table on which the substrate is supported. The liquid may be confined to the immersion space by a fluid seal. The fluid handling structure may create or use a flow of gas, for example to help in controlling the flow and/or the position of the liquid in the immersion space. The flow of gas may help form the seal to confine the liquid to the immersion space.

However, use of an immersion system may lead to defects forming on a top surface of the substrate. Defects can be caused by a droplet of immersion fluid being left behind after the substrate passes under the fluid handling structure. In particular, at least two main mechanisms which result in defects are known, which are called bulldozing and film pulling. Defects on the surface of the substrate may lead to errors on the surface of the substrate which can reduce yield. Defects may mean watermarks in particular, or may mean other defects which may occur on the surface of the substrate.

Film pulling may occur as the substrate is moved relative to an immersion system (such as the fluid handling structure or the like). As the surface of the substrate moves relative to the immersion fluid, any variation (such as an edge of the substrate) or irregularity on the surface of the substrate such as a change in the contact angle which the immersion liquid makes with the surface of the substrate may act as a meniscus pinning feature as the immersion fluid passes over it. This means that as the fluid handling structure moves relative to the substrate, the meniscus of the immersion fluid between the surface of the substrate and the fluid handling structure is stretched. After the fluid handling structure has moved a certain distance, the meniscus will eventually break and immersion fluid is left on the surface of the substrate resulting in droplets on the substrate which can lead to watermark defects. The remaining droplets may thus lead to errors on the surface of the photosensitive material which can reduce yield. Film pulling may be reduced by increasing the gas flow of a gas knife at a receding side of the fluid handling structure. However, this may have other consequences at an advancing side of the fluid handling structure. For example, using an increased gas flow for the gas knife will increase "bulldozing" at the advancing side of the fluid handling structure as described below.

Bulldozing may also occur when the substrate is moved relative to the fluid handling structure. Bulldozing occurs when a droplet of immersion fluid is encountered which is ahead of the fluid handling structure. As the substrate moves, the advancing portion of the fluid handling structure collides with the droplet of immersion fluid and the droplet is pushed forwards by the fluid handling structure. As the droplet is pushed forward, defects are created on the surface of the substrate. Although this may be effectively reduced by reducing the gas flow of a gas knife at the advancing side of the fluid handling structure, this may have other consequences. For example, using a reduced gas flow for the gas knife may mean that the confined immersion fluid is more likely to escape from the fluid handling structure at the receding side of thus leading to further defects.

The key aspect of a fluid handling structure is the successful confinement of the liquid to the immersion space. Leaking of liquid out of the immersion space can result in defects in the patterned substrate. Liquid left behind on the substrate after it passes out from under the fluid handling structure can lead to drying marks and/or leaching of the photoresist and thereby defects in any eventual device.

Factors which affect the performance of the fluid handling structure with respect to confinement of the immersion liquid include the operating parameters of the fluid handling structure (for example fluid flow rates into and out of the fluid handling structure), the nature of the immersion liquid, the nature of the resist, particularly the contact angle which the immersion liquid makes with the resist, and the route taken by the substrate under the fluid handling structure, the way edges of the substrate are treated, the distance of the bottom surface of the fluid handling structure to the substrate (called fly height) and the speed of the relative motion of the fluid handling structure to the substrate.

Currently the performance of a fluid handling structure for a given set of working parameters and/or exposure recipe is determined in a time consuming and laborious way. That is, a substrate is processed and imaged as normal in a lithographic apparatus using the working parameters and exposure recipe being tested. An exposure recipe includes the path taken by the substrate under the projection system, the way in which the substrate is exposed, the nature of the immersion liquid and the resist used on the substrate. The substrate is then developed and its top surface finally inspected by scanning electron microscope. This system of performance testing working parameters of a fluid handling structure or performance testing a fluid handling structure and associated working parameters for a given exposure recipe of a substrate advantageously can distinguish between different types of defects, for example between defects generated by film pulling and bulldozing and defects arising from other sources not connected with film pulling or bulldozing, but suffers from being very time consuming and so exposure and requiring operator interpretation of the images.

SUMMARY

It is desirable, to provide a method of performance testing a fluid handling structure.

According to an aspect, there is provided a method of performance testing working parameters of a fluid handing structure in an immersion lithographic apparatus, the method comprising: placing a test substrate comprising an upper surface with a first portion with a resist defining the upper surface and a second portion with a material different from the resist defining the rest of the upper surface on a table in the immersion lithographic apparatus, confining liquid on a region of an upper surface of the table and/or the upper surface of the test substrate by operating the fluid handing structure using the associated working parameters, moving the table such that the region moves from the second portion to the first portion; detecting change to and/or residue on the first portion as a result of liquid being left behind on the first portion during the moving.

According to an aspect, there is provided a method of performance testing a fluid handing structure and associated working parameters for a given exposure recipe of a substrate in an immersion lithographic apparatus, the method comprising: placing the substrate comprising an upper surface coated with resist on a table in the immersion lithographic apparatus; confining liquid between a projection system of the immersion lithographic apparatus and the table and/or the substrate by operating the fluid handing structure using the associated working parameters; moving the table under the fluid handing structure according to the exposure recipe and exposing the resist with a patterned beam of radiation according to the exposure recipe; and detecting change to and/or residue on the resist as a result of liquid being left behind on the resist by directing electromagnetic radiation at the resist and collecting non zeroth order diffracted radiation reflected from the resist.

According to an aspect, there is provided a method of performance testing a fluid handing structure and associated working parameters for a given exposure recipe of a substrate in an immersion lithographic apparatus, the method comprising: placing the substrate comprising an upper surface coated with resist on a table in the immersion lithographic apparatus; confining liquid between a projection system of the immersion lithographic apparatus and the table and/or the substrate by operating the fluid handing structure using the associated working parameters; allowing at least partial evaporation of any immersion liquid on the dosage sensor thereby to induce a cooling load on the dosage sensor; third moving the dosage sensor under the fluid handing structure; irradiating in which the dosage sensor is exposed to a radiation beam from the projection system of the immersion lithographic apparatus; measuring response of the dosage sensor to the irradiating and determining the cooling load on the basis that the dose of the irradiating step is known and any divergence from the known dose in the measuring is due to a temperature sensitivity of the dosage sensor.

Brief Description of the Drawings Embodiments of the invention will now be described, by way of example only, with reference to the accompanying schematic drawings in which corresponding reference symbols indicate corresponding parts, and in which:

FIG. 1 schematically depicts a lithography apparatus;

FIG. 2 schematically depicts a fluid handling structure for use in the lithographic apparatus;

FIG. 6 is a flow diagram of the third embodiment; and

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include:

a programmable mirror array; more information on such mirror arrays is given in U.S. Pat. Nos. 5,296,891 and 5,523,193, which are incorporated herein by reference; and a programmable LCD array; an example of such a construction is given in U.S. Pat. No. 5,229,872, which is incorporated herein by reference.

Figure 1:
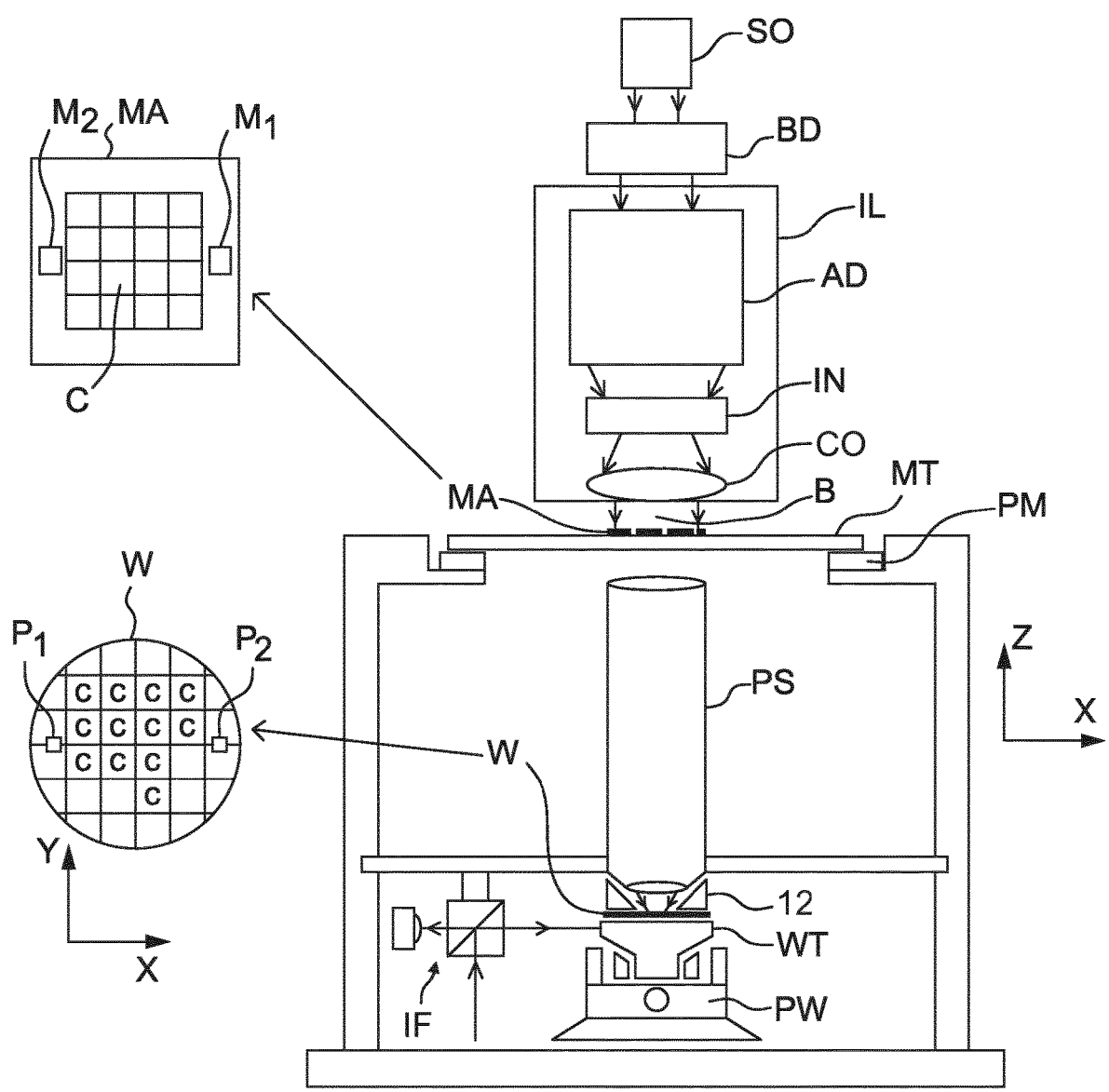

FIG. 1 schematically depicts a lithography apparatus. The apparatus includes, optionally, an illumination system (illuminator) IL configured to condition a projection beam B (e.g. UV radiation or any other suitable radiation), a support structure (e.g. a mask table) MT constructed to support a patterning device (e.g. a mask) MA and connected to a first positioning device PM configured to accurately position the patterning device in accordance with certain parameters. The apparatus also includes a support table (e.g. a wafer table) WT or "substrate support" or "substrate table" constructed to hold a substrate (e.g. a resist-coated wafer) W and connected to a second positioning device PW under control of positioner 130 configured to accurately position the substrate in accordance with certain parameters. The apparatus further includes a projection system (e.g. a refractive projection lens system) PS configured to project a pattern imparted to the projection beam B by the patterning device MA onto a target portion C (e.g. including one or more dies) of the substrate W.

In operation, an illuminator IL receives a radiation beam B from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system".

The lithographic apparatus may be of a type having two or more support tables WT, e.g., two or more support tables or a combination of one or more support tables and one or more cleaning, sensor or measurement tables. For example, the lithographic apparatus is a multi-stage apparatus comprising two or more tables located at the exposure side of the projection system, each table comprising and/or holding one or more objects. In an example, one or more of the tables may hold a radiation-sensitive substrate. In an example, one or more of the tables may hold a sensor to measure radiation from the projection system. In an example, the multi-stage apparatus comprises a first table configured to hold a radiation-sensitive substrate (i.e., a support table) and a second table not configured to hold a radiation-sensitive substrate (referred to hereinafter generally, and without limitation, as a measurement, sensor and/or cleaning table). The second table may comprise and/or may hold one or more objects, other than a radiation-sensitive substrate. Such one or more objects may include one or more selected from the following: a sensor to measure radiation from the projection system, one or more alignment marks, and/or a cleaning device (to clean, e.g., the fluid handling structure).

In operation, the radiation beam B is incident on the patterning device MA, which is held on the support structure MT, and is patterned by the pattern (design layout) present on patterning device MA. Having traversed the patterning device MA, the radiation beam B passes through the projection system PS, which focuses the beam onto a target portion C of the substrate W. With the aid of the second positioning device PW and position sensor IF (e.g. an interferometric device, linear encoder, 2-D encoder or capacitive sensor), the support table WT can be moved accurately, e.g. so as to position different target portions C in the path of the radiation beam B at a focused and aligned position. Similarly, a first positioner PM and another position sensor (which is not explicitly depicted in FIG. 1) can be used to accurately position the patterning device MA with respect to the path of the radiation beam B. Patterning device MA and substrate W may be aligned using patterning device alignment marks M1, M2 and substrate alignment marks P1, P2. Although the substrate alignment marks M1, M2 as illustrated occupy dedicated target portions, they may be located in spaces between target portions C (these are known as scribe-lane alignment marks).

The lithographic apparatus further includes a control unit which controls all the movements and measurements of the various actuators and sensors described. The control unit also includes signal processing and data processing capacity to implement desired calculations relevant to the operation of the lithographic apparatus. In practice, the control unit will be realized as a system of many sub-units, each handling the real-time data acquisition, processing and control of a subsystem or component within the lithographic apparatus. For example, one processing subsystem may be dedicated to servo control of the second positioning device PW. Separate units may handle different actuators, or different axes. Another sub-unit might be dedicated to the readout of the position sensor IF. Overall control of the lithographic apparatus may be controlled by a central processing unit. The central processing unit may communicate with the sub-units, with operators and with other apparatuses involved in the lithographic manufacturing process.

Arrangements for providing liquid between a final optical element of the projection system PS and the substrate can be classed into three general categories. These are the bath type arrangement, the so-called localized immersion systems and the all-wet immersion systems. An embodiment of the present invention relates particularly to the localized immersion systems.

Figure 2:
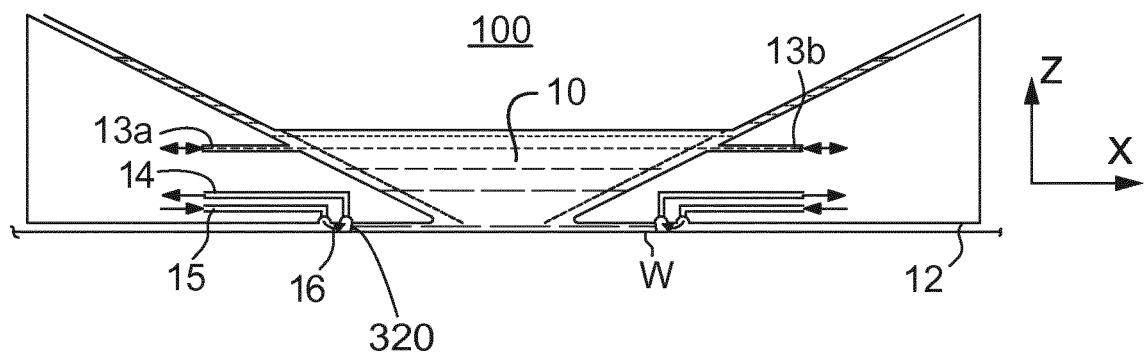

In an arrangement which has been proposed for a localized immersion system a fluid handling structure 12 extends along at least a part of a boundary of an immersion space 10 between the final optical element 100 of the projection system PS and the facing surface of the stage or table facing the projection system PS. The facing surface of the table is referred to as such because the table is moved during use and is rarely stationary. Generally, the facing surface of the table is a surface of a substrate W, support table WT, e.g. the substrate table which surrounds the substrate W or both. Such an arrangement is illustrated in FIG. 2. The arrangement illustrated in FIG. 2 and described below may be applied to the lithography apparatus described above and illustrated in FIG. 1.

FIG. 2 schematically depicts the fluid handling structure 12. The fluid handling structure 12 extends along at least a part of a boundary of the immersion space 10 between the final optical element 100 of the projection system PS and the support table WT or substrate W. In an example, a seal is formed between the fluid handling structure 12 and the surface of the substrate W/support table WT. The seal may be a contactless seal such as a gas seal 16 (such a system with a gas seal is disclosed in EP1 420 298) or a liquid seal.

The fluid handling structure 12 is configured to supply and confine immersion fluid, e.g., liquid, to the immersion space 10. Immersion fluid is brought into the immersion space 10 through one of liquid openings, e.g., opening 13a. The immersion fluid may be removed through one of liquid openings, e.g., opening 13b. The immersion fluid may be brought into the immersion space 10 through at least two liquid openings, e.g., opening 13a and opening 13b. Which of liquid openings is used to supply immersion fluid and optionally which is used to remove immersion liquid may depend on the direction of motion of the support table WT.

Immersion fluid may be contained in the immersion space 10 by the gas seal 16 which, during use, is formed between the bottom of the fluid handling structure 12 and the facing surface of the table (i.e. the surface of the substrate W and/or the surface of the support table WT). The gas in the gas seal 16 is provided under pressure via gas inlet 15 to a gap between the fluid handling structure 12 and substrate W and/or support table WT. The gas is extracted via a channel associated with gas outlet 14. A meniscus 320 forms at a boundary of the immersion fluid. Such a system is disclosed in US 2004-0207824. Other fluid handling structures 12 can be used with embodiments of the present invention.

Figure 3:
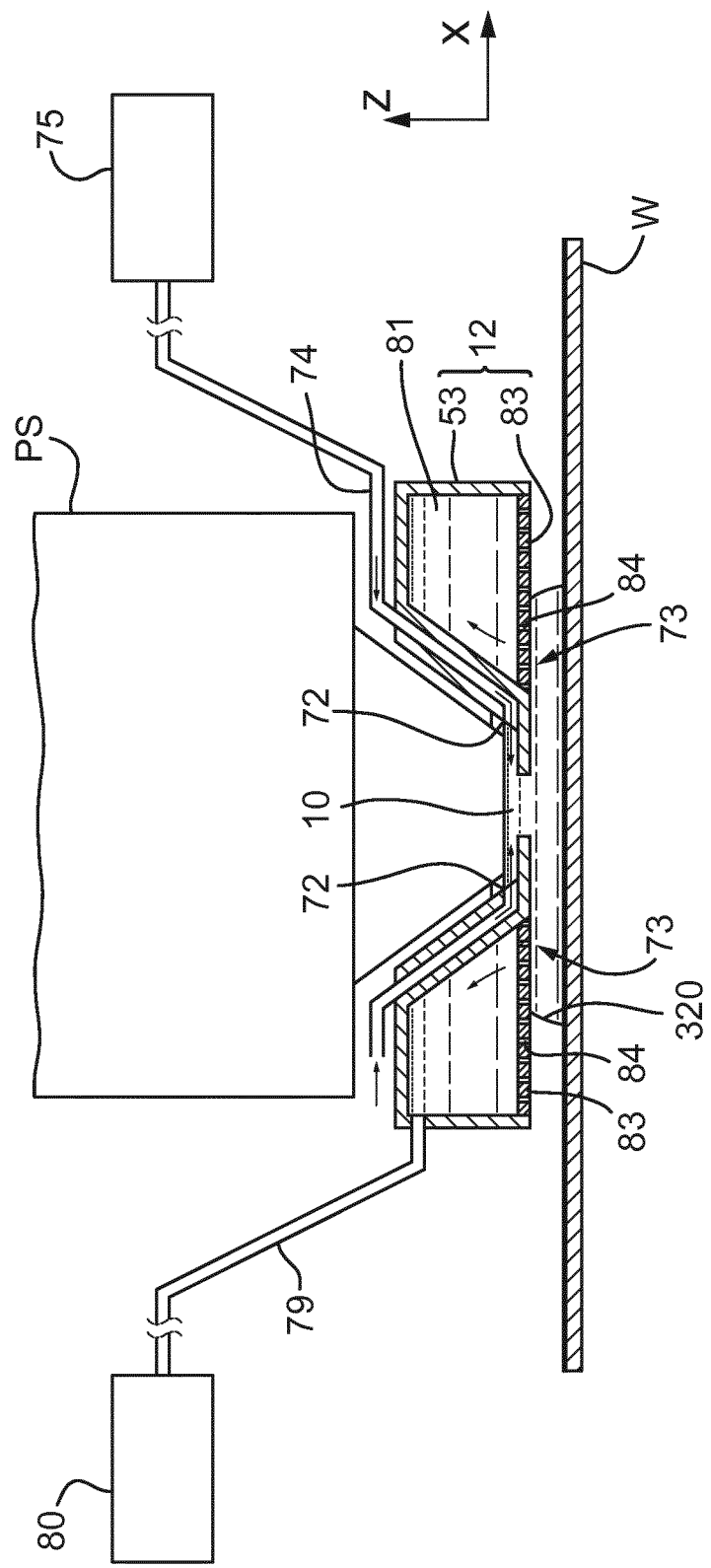
FIG. 3 is a side cross sectional view that depicts a further liquid supply system.

FIG. 3 is a side cross sectional view that depicts a further liquid supply system or fluid handling system according to an example. The arrangement illustrated in FIG. 3 and described below may be applied to the lithographic apparatus described above and illustrated in FIG. 1. The liquid supply system is provided with a fluid handling structure 12 (or a liquid confinement structure), which extends along at least a part of a boundary of the space 10 between the final element of the projection system PS and the support table WT or substrate W.

The fluid handling structure 12 at least partly confines the immersion liquid in the space 10 between the final element of the projection system PS and the substrate W. The space 10 is at least partly formed by the fluid handling structure 12 positioned below and surrounding the final element of the projection system PS. In an example, the fluid handling structure 12 comprises a main body member 53 and a porous member 83. The porous member 83 is plate shaped and has a plurality of holes (i.e., openings or pores). In an example, the porous member 83 is a mesh plate wherein numerous small holes 84 are formed in a mesh. Such a system is disclosed in US 2010-0045949 A1, which is hereby incorporated by reference in its entirety.

The main body member 53 comprises supply ports 72, which are capable of supplying the immersion liquid to the space 10, and a recovery port 73, which is capable of recovering the immersion liquid from the space 10. The supply ports 72 are connected to a liquid supply apparatus 75 via passageways 74. The liquid supply apparatus 75 is capable of supplying the immersion liquid to the supply ports 72 through the corresponding passageway 74. The recovery port 73 is capable of recovering the immersion liquid from the space 10. The recovery port 73 is connected to a liquid recovery apparatus 80 via a passageway 79. The liquid recovery apparatus 80 recovers the immersion liquid recovered via the recovery port 73 through the passageway 79. The porous member 83 is disposed in the recovery port 73. Performing the liquid supply operation using the supply ports 72 and the liquid recovery operation using the porous member 83 forms the space 10 between the projection system PS and the fluid handling structure 12 on one side and the substrate W on the other side.

In order to determine the performance of a fluid handling structure, embodiments described below make use of sensors used in lithography for quantifying particles on a substrate or for determining the dose of the radiation beam B (i.e. the energy contained in the radiation beam B). The embodiments are advantageous because they are much quicker than detecting defects resulting from film pulling or bulldozing using an SEM image. This potentially allows the measurements to be used in a feedback control loop in order, in real time, to improve the performance of the fluid handling structure by adjusting working parameters. The method may or may not be performed in the lithographic apparatus.

In the first two embodiments, scatterometry is used to detect damage to a substrate resulting from immersion liquid being present on the substrate for an extended period of time (e.g. leaching) or residue on the substrate from evaporated immersion liquid.

In the third embodiment the temperature sensitivity of a dosage sensor is used to determine the quantity of immersion liquid left on it by a fluid handling structure which results in an evaporational cooling load on the sensor.

The embodiments provide quick results compared to analysing an SEM image which has been used previously to quantify the performance of a fluid handling structure. In the second embodiment the results obtained compare favourably with the laborious method of collecting data through a scanning electron microscope image. In the first and third embodiments the results detect the same trends as the more laborious SEM image analysis method. The first and second embodiments thereby allow the results to be used to change the working parameters to improve the performance of the fluid handling structure.

Figure 4:
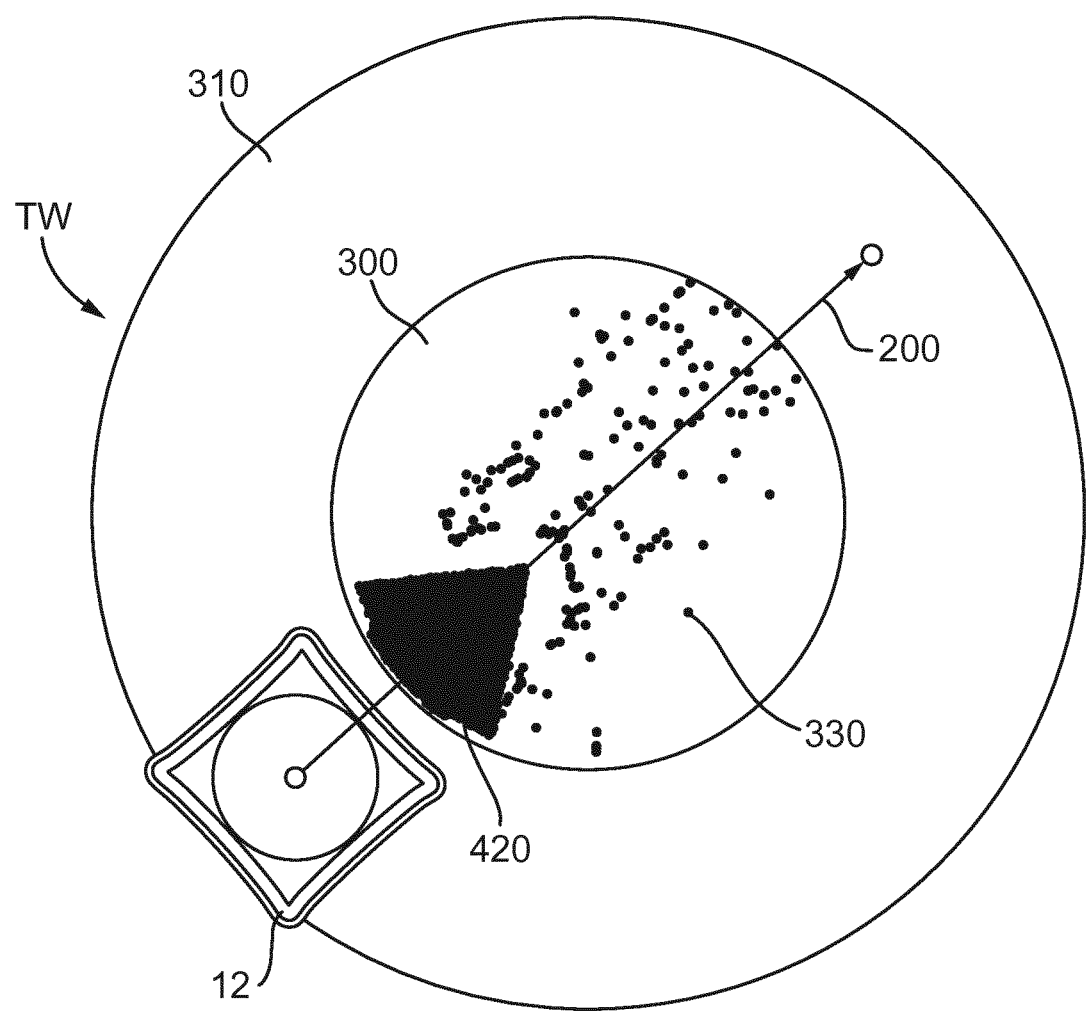
FIG. 4 shows, in plan, a fluid handling structure and a test substrate according to a first embodiment.

The first embodiment will now be described with reference to FIG. 4. In the first embodiment a test substrate TW is provided. The test substrate TW is first fully coated with resist. Before being placed in the lithographic apparatus an outer portion of the resist is removed. This leaves a central first portion 300 with a resist defining an upper surface. A second portion 310 is provided radially outward of the first portion 300 with a material different from the resist defining the upper surface. The material different from the resist may be the bulk material of the test substrate TW or a coating. A difference in contact angle which the immersion liquid makes with the material of the upper surface of the first portion 300 and the upper surface of the second portion 310 results in a film pulling force being applied to the meniscus 320 which extends between the fluid handling structure 12 and the test substrate TW as the test substrate TW moves under the fluid handling structure 12. The precise location, size and shape of the first and second portions 300, 310 in unimportant and what is illustrated in FIG. 4 is only an example.

In an embodiment the test substrate TW is placed on a table in a lithographic apparatus, e.g., a support table WT. Liquid is confined to a region of the upper surface of the table and/or the upper surface of the test substrate TW (i.e. outside of the first portion 300). The fluid handling structure 12 is operated using the working parameters which are currently being tested. The fluid handling structure 12 is then moved relative to the test substrate TW so that an edge of the first portion 300 is passed over by the fluid handling structure 12. That is, the table on which the test substrate TW is placed is moved such that the region to which the immersion liquid is confined moves from the second portion 310 to the first portion 300.

In the first embodiment the radiation beam B may be on during the moving of the table but is off in a preferred embodiment.

As the edge of the first portion 300 moves out from under the fluid handling structure 12, a film pulling force will act on meniscus 320 due to the difference in contact angle between the upper surface of the first portion 300 and the upper surface of the second portion 310. Liquid left behind by this film pulling will result in drying water marks (e.g. residue) and/or leaching of the resist at the location at which the liquid is left behind. In FIG. 4 the black dots represent locations at which the presence of a change to resist and/or residue from immersion liquid is detected (described below). The triangular shape of region 420 of high density detection of change to resist and/or residue is characteristic of sort of leaking phenomenon detected at an edge of a substrate where film pulling occurs at the edge of a substrate when the edge of a substrate is passed over by the fluid handling structure using the SEM prior art defect detection system. A major benefit of the present invention is that the characteristics of the region 420 are independent of any measures taken at the edge of a substrate including a fluid flow rate of fluid from the edge of a substrate for preventing gas entrainment in the immersion liquid during crossing of a substrate edge. Therefore the characteristics of the region 420 are only dependent upon the characteristics of the upper surface of the first portion 300 and the upper surface of the second portion 310 and the working parameters of the fluid handling structure 12.

In the embodiment illustrated in FIG. 4 a move of the test substrate TW is such that the probability of leaking of liquid is maximized. This is achieved by moving a edge of the liquid confinement structure 12 in such a way that its leading edge is substantially parallel to an edge of the first portion 300 which it is to cross. For fluid handling structures 12 with different geometries the direction of expected worst performance may differ.

Preferably the test substrate TW is only moved under the fluid handling structure 12 once. This means that the presence of changes to resist and/or residue can be assigned to the single crossing of the edge of the first portion 300 and to no other factor, such as passing over a previously passed over area or a change in direction of movement etc.

The individually isolated detected changes to the resist and/or residue 330 are random droplets of leaked immersion liquid not connected with film pulling at the boundary of the first and second portions 300, 310.

On the basis of the results the working parameters of the fluid handling structure 12 can be changed in order to reduce the amount of liquid in region 420. It is expected that by reducing the amount of liquid in region 420 for the test substrate TW illustrated in FIG. 4, that the same changes in working parameters will achieve improved performance during use of the apparatus for imaging an actual substrate.

Figure 5:
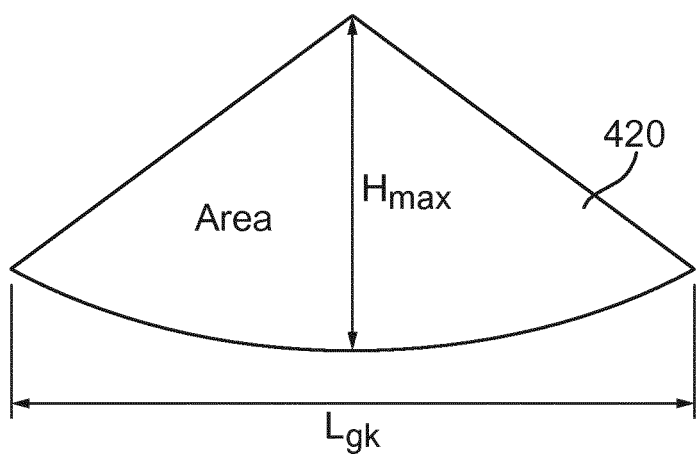
FIG. 5 illustrates schematically results which can be extracted from the method of the first embodiment.

FIG. 5 illustrates the region 420 and dimensions which can be measured, namely a length of the triangle $L_{gk}$, a height of the triangle ($H_{max}$) and an area of the triangle. It has been found that at least the variation in height of the triangle ($H_{max}$) with different working parameters of the fluid handling structure 12 matches well to the defect counts achieved using the traditional SEM analysis method. This shows that optimizing the working parameters based on the parameter ($H_{max}$) will also optimize the working parameters for use during imaging processing of a substrate.

An alternative metric may be to count the number of individual defects which are detected within a certain area, for example within the area of the region 420, the region 420 being defined by an area covered by a certain density of counts, for example. Another parameter which can be measured is the size of the droplets left behind by the fluid handling structure 12.

The detecting may be done in any way. Preferably the detecting is done in a contactless way. In one embodiment in order quickly to detect the tell tale signs of the presence of immersion liquid, use is made of an apparatus (a scatterometer) which is normally used to detect particles on a substrate. This apparatus may normally be used prior to placing the substrate W into the lithographic apparatus or after removing the substrate W from the lithographic apparatus. In the present method of performance testing working parameters of a fluid handling structure 12, the apparatus is used after the test substrate TW is removed from the lithographic apparatus in which it was moved under the fluid handling structure 12. In the apparatus electromagnetic radiation (different from the radiation beam B) is directed at the first portion 300. Non-zeroth order diffracted radiation reflected by the first portion 300 is detected. The presence of defects in the resist and/or residue due to immersion liquid having been present on the resist can be detected by changes in the non-zeroth order reflected diffracted radiation which is detected.

The detecting may occur within the lithographic apparatus or outside of the lithographic apparatus.

In the second embodiment, which is the same as the first embodiment except as described below, a normal substrate W is used. The substrate W is moved under the projection system and fluid handling structure 12 in the same way (i.e. using the same exposure recipe) as during normal exposure of a substrate W. After the substrate W has been exposed by the radiation beam B in the lithographic apparatus, the same apparatus as used in the first embodiment is used to detect change to and/or residue on the resist as a result of immersion liquid being left behind on the resist. This may take place in the lithographic apparatus or outside of the lithographic apparatus.

The detecting is performed without developing the resist (like in the first embodiment). Therefore in contrast to the previous method of imaging, developing a resist and then inspecting the developed resist using SEM, in the second embodiment the resist is left undeveloped and any changes to and/or residue on the resist is detected by directing electromagnetic radiation at the resist and collecting non-zeroth order diffracted radiation reflected from the resist. This electromagnetic radiation is a relatively low dose and at a different wavelength to the radiation beam B. Instead of measuring directly after exposure, it is possible to apply a post immersion rinse (or post soak) after exposure by the radiation beam B to recover (partially) from watermarks. The measured substrate will then show the amount of watermarks present of the complete process.

In principle, it is possible to still develop the substrate W after the detecting. This enables the method to be used on production substrates.

In the second embodiment the position of each individual defect can be detected and its likely origin based on film pulling or bulldozing can be assumed based on its detected location.

Experiments have shown a good correlation between the results of measurements using the traditional SEM approach compared to those of the second embodiment. The results are thought to be superior to the same method except that the substrate W is not exposed because exposure of the substrate W is believed to change the immersion liquid's contact angle with the resist (the resist becomes less hydrophobic), so that the same method of performance testing without exposing the resist to the radiation beam B according to the exposure recipe results in different apparent performance of the fluid handling structure 12 using the same associated working parameters.

In an embodiment, there is provided a method of performance testing working parameters of a fluid handing structure in an immersion lithographic apparatus, the method comprising: placing a test substrate comprising an upper surface with a first portion with a resist defining the upper surface and a second portion with a material different from the resist defining the rest of the upper surface on a table in the immersion lithographic apparatus, confining liquid on a region of an upper surface of the table and/or the upper surface of the test substrate by operating the fluid handing structure using the associated working parameters, moving the table such that the region moves from the second portion to the first portion, and detecting change to and/or residue on the first portion as a result of liquid being left behind on the first portion during the moving.

In an embodiment, the detecting is contactless. In an embodiment, the moving is such that the fluid handing structure passes over an area of the first portion on which the detecting is performed a single time. In an embodiment, the moving is performed without exposing the test substrate. In an embodiment, the detecting comprises directing electromagnetic radiation at the first portion and detecting non zeroth order diffracted radiation reflected from the first portion.

In an embodiment, there is provided a method of performance testing a fluid handing structure and associated working parameters for a given exposure recipe of a substrate in an immersion lithographic apparatus, the method comprising: placing the substrate comprising an upper surface coated with resist on a table in the immersion lithographic apparatus; confining liquid between a projection system of the immersion lithographic apparatus and the table and/or the substrate by operating the fluid handing structure using the associated working parameters; moving the table under the fluid handing structure according to the exposure recipe and exposing the resist with a patterned beam of radiation according to the exposure recipe; and detecting change to and/or residue on the resist as a result of liquid being left behind on the resist by directing electromagnetic radiation at the resist and collecting non zeroth order diffracted radiation reflected from the resist.

In an embodiment, the method further comprises, prior to the placing, locating the position of defects in the resist; and wherein the detecting further comprises removing from the collected non-zeroth order diffracted radiation resulting from interaction with the located defects. In an embodiment, the exposing includes exposing reticle patterns on the resist and the detecting further comprises removing from the collected non-zeroth order diffracted radiation resulting from interaction with the reticle patterns on the resist. In an embodiment, the electromagnetic radiation is from a source different from an exposure source for generating a patterned beam of radiation. In an embodiment, the resist is undeveloped during the detecting. In an embodiment, the method further comprises determining a performance of the fluid handing structure and associated working parameters based on the detecting. In an embodiment, the method further comprises changing the associated working parameters according to the results of the determining.

In an embodiment, there is provided a method of detecting loss of immersion liquid from a fluid handing structure in an immersion lithographic apparatus, the method comprising: first moving a dosage sensor on a table under the fluid handing structure thereby to cover the dosage sensor with the immersion liquid and to condition the dosage sensor; second moving the dosage sensor out from under the fluid handing structure; allowing at least partial evaporation of any immersion liquid on the dosage sensor thereby to induce a cooling load on the dosage sensor; third moving the dosage sensor under the fluid handing structure; irradiating in which the dosage sensor is exposed to a radiation beam from the projection system of the immersion lithographic apparatus; measuring response of the dosage sensor to the irradiating and determining the cooling load on the basis that the dose of the irradiating step is known and any divergence from the known dose in the measuring is due to a temperature sensitivity of the dosage sensor.

In an embodiment, in the irradiating the dosage sensor is exposed multiple times and in the measuring the response of the sensor is measured for each exposure. In an embodiment, the dosage sensor is exposed multiple times until divergence from the known dose is below a predetermined magnitude. In an embodiment, a time taken for the divergence to fall below the predetermined magnitude is at least partly used in determining the cooling load. In an embodiment, the first moving, second moving, allowing, third moving, irradiating and measuring are performed multiple times in which successive allowing at least partial evaporation Is carried out for different lengths of time.

The detecting of the first and second embodiments cannot distinguish between the origins of defects. Therefore defects in the resist which are present before placing the substrate in the immersion lithographic apparatus will appear as defects resulting from liquid leaking from the fluid handling structure 12 unless they are otherwise eliminated. In order to eliminate this source of defects from the results, in an embodiment the position of any defects in the resist are located prior to placing the substrate W or the test substrate TW in the lithographic apparatus. When the detecting occurs, any detections at the locations of the prior located defects are removed, thereby further improving the correlation between the SEM method of performance testing and the first and second embodiments.

Additionally, an exposure recipe usually includes exposing reticle patterns on the resist and these patterns on the resist can also result in the generation of non zeroth order diffracted radiation being reflected from the resist. This reflected radiation could be mistaken for a change to and/or residue on the resist as a result of immersion liquid being left behind on the resist. In order to eliminate such false positives from the detecting step, non-zeroth order diffracted radiation reflected from the resist which is a result of interaction of the electromagnetic radiation with exposed patterns on the resist is removed from the results. This effectively means that pre-existing defects are not mistaken by the method as being a defect introduced by immersion liquid being left behind on the substrate W by the fluid handling structure 12.

The third embodiment as explained below with reference to FIG. 6 only measures leaking liquid as a result of film pulling (i.e. liquid left behind by the fluid handling structure 12). In this embodiment the fluid handling structure 12 is moved over a dosage sensor which is mounted on the support table WT in step 610. This conditions the fluid handling structure 12 to the temperature of the immersion liquid which is accurately known. In step 620 the fluid handling structure 12 is moved off the dosage sensor. Liquid left behind on the dosage sensor evaporates thereby changing the temperature of the dosage sensor. The cooling load on the dosage sensor will be proportional to the amount of immersion liquid left behind on it.

It is known that the dosage sensor is temperature sensitive meaning that the measured dose varies depending upon the temperature of the dosage sensor for a given actual dose of radiation provided to the dosage sensor. In other words, the difference in the actual exposed dose on the dosage sensor and the measured dosage on the sensor can be correlated to the temperature of the dosage sensor, because it is known that the dosage sensor is temperature dependent.

After a pre-determined time the dosage sensor is moved back under the fluid handling structure 12 in step 630. Once the dosage sensor is under the fluid handling structure 12 the dosage sensor is irradiated with the radiation beam B with a known dosage (any other beam of radiation can also be used) in step 640. The dosage measured by the dosage sensor will depend upon the temperature of the dosage sensor. In other words, the reading of the dosage sensor depends on the temperature of the dosage sensor itself, for example if the actual dose is constant, depending on the temperature of the dosage sensor the reading of the dosage sensor can be higher or lower (is not constant). By knowing the variation in measured dosage with temperature for a given known actual dosage, it is possible to tell from the measured dosage the temperature of the dosage sensor. From the temperature of the dosage sensor the cooling load due to evaporation can be calculated and from this the amount of liquid left behind by the fluid handling structure 12 which is the output of step 650. Thus, the response of the dosage sensor to the irradiating is measured and the cooling load is determined on the basis that the dose of the irradiating step is known and any divergence from the known dose in the measuring is due to a temperature sensitivity of the dosage sensor. As the dosage sensor is under the fluid handling structure 12, the dosage sensor will be thermally conditioned by the immersion liquid from the fluid handling structure 12. Thereby the temperature of the fluid handling structure 12 will return towards the temperature of the immersion liquid. The dosage sensor may be irradiated two or more times by the radiation beam B whilst it is under the fluid handling structure 12 (illustrated by arrow 660). The detected dosage will tend towards the actual dosage as the dosage sensor heats up.

Figure 7:
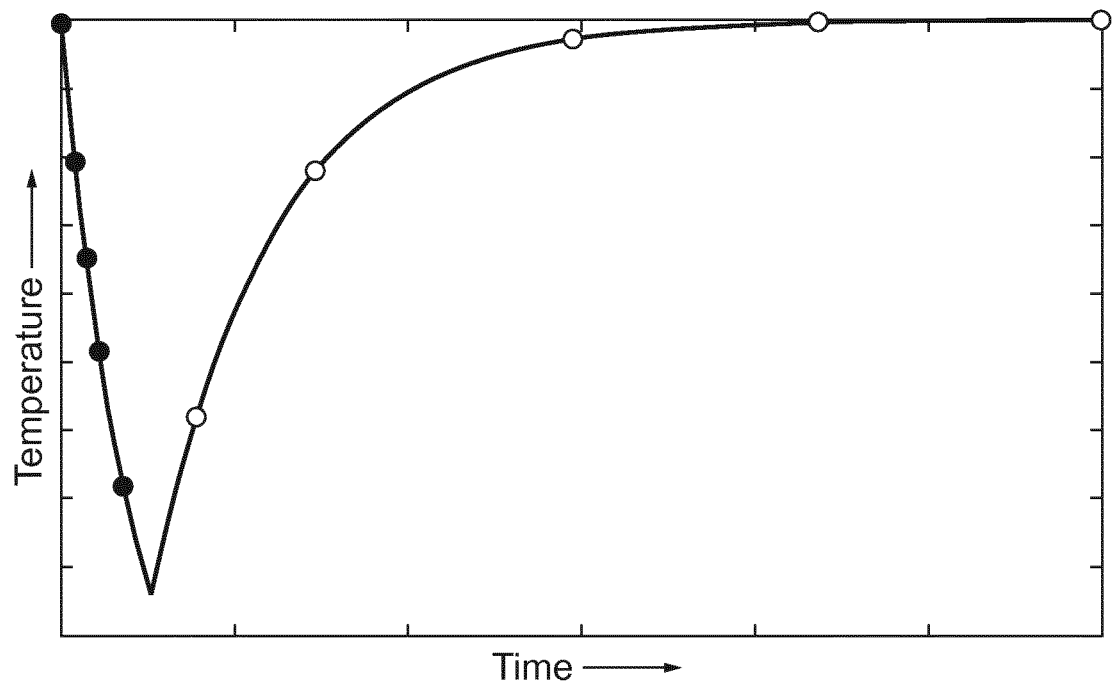
FIG. 7 shows the variation in temperature of a dosage sensor with time during the method of the third embodiment.

FIG. 7 illustrates the change in temperature of the dosage sensor with time. At time t equal to zero the dosage sensor moves from under the fluid handling structure 12 for the first time. Evaporation of the immersion liquid left behind on the dosage sensor immediately starts and cools the temperature of the dosage sensor down. Once the dosage sensor is moved back under the fluid handling structure 12 the temperature of the dosage sensor increases until it reaches the temperature of the immersion liquid. Irradiating the dosage sensor several times once it is under the fluid handling structure 12 improves the accuracy of the method.

It is also possible to improve the accuracy of the method by performing the test multiple times and allowing the immersion liquid left behind on the dosage sensor to evaporate for different amounts of time before the dosage sensor is moved back under the fluid handling structure 12.

In one embodiment the amount of time taken for the measurements made by the dosage sensor to equal the expected dosage level is taken as being indicative of the cooling load applied to the dosage sensor as a result of the evaporation and thereby the quantity of immersion liquid left behind on the dosage sensor after it moves out from under the fluid handling structure 12.

By using the method of the third embodiment, it is possible to establish the effect of each working parameter of the fluid handling structure 12 on the amount of immersion liquid it leaves behind on the dosage sensor. This allows testing of the operating parameters of the fluid handling structure 12 to be performed within the lithographic apparatus without needing to use a separate machine or apparatus. Indeed a test procedure could be automated thereby not requiring operator input other than to set the test up. The output from the machine could be a table of results giving a parameter indicative of the amount of immersion liquid lost relative to various changing operating parameters of the fluid handling structure 12 including fluid flow rates, distance of the fluid handling structure 12 away from the surface of the table in which the dosage sensor is mounted and speed of relative movement between the fluid handling structure 12 and the dosage sensor.

Although specific reference may be made in this text to the use of lithography apparatus in the manufacture of ICs, it should be understood that the lithography apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components.

While specific embodiments have been described above, it will be appreciated that embodiments of the invention may be practiced otherwise than as described. The descriptions above are intended to be illustrative, not limiting. Thus, it will be apparent to one skilled in the art that modifications may be made to the invention as described without departing from the scope of the claims set out below without departing from the scope of the claims set out below.

The invention claimed is:

1. A method of performance testing working parameters of a fluid handing structure in an immersion lithographic apparatus, the method comprising:
   confining liquid to a region adjacent an upper surface of a table in the immersion lithographic apparatus and/or the upper surface of a test substrate by operating the fluid handing structure using the associated working parameters, wherein the upper surface of the test substrate comprises a first portion with a resist defining the upper surface of the first portion and a second portion with a material different from the resist defining the rest of the upper surface of the substrate, wherein a difference between the first and second portions is such that there is a film pulling force applied to a meniscus of the liquid confined to the region;
   moving the substrate such that at least part of the region moves from the second portion to the first portion; and
   detecting change to and/or residue on the first portion as a result of liquid being left behind on the first portion during the moving.

2. The method of claim 1, wherein the detecting is contactless.

3. The method of claim 1, wherein the moving is such that an area of the first portion on which the detecting is performed passes under the fluid handing structure a single time.

4. The method of claim 1, wherein the moving is performed without exposing the test substrate.

5. The method of claim 1, wherein the detecting comprises directing electromagnetic radiation at the first portion and detecting non zeroth order diffracted radiation reflected from the first portion.

6. The method of claim 1, wherein the resist is undeveloped during the detecting.

7. The method of claim 1, further comprising determining a performance of the fluid handing structure and one or more associated working parameters based on the detecting.

8. The method of claim 7, further comprising changing one or more of the one or more associated working parameters according to the results of the determining.

9. A method of performance testing a fluid handing structure and associated working parameters for a given exposure recipe of a substrate in an immersion lithographic apparatus, the method comprising:
confining liquid between a projection system of the immersion lithographic apparatus and a table and/or the substrate by operating the fluid handing structure using the associated working parameters, the substrate comprising an upper surface coated with resist;
moving the substrate under the fluid handing structure according to the exposure recipe and exposing the resist with a patterned beam of radiation according to the exposure recipe; and
detecting change to and/or residue on the resist as a result of liquid being left behind on the resist by directing electromagnetic radiation at the resist and collecting non zeroth order diffracted radiation reflected from the resist.

10. The method of claim 9, further comprising, prior to the exposing, locating the position of defects in the resist; and
wherein the detecting further comprises removing, from results associated with the collected non-zeroth order diffracted radiation, results associated with radiation resulting from interaction with the located defects.

11. The method of claim 9, wherein the exposing includes exposing reticle patterns on the resist and the detecting further comprises removing, from results associated with the collected non-zeroth order diffracted radiation, results associated with radiation resulting from interaction with the reticle patterns on the resist.

12. The method of claim 9, wherein the electromagnetic radiation is from a source different from an exposure source for generating the patterned beam of radiation.

13. The method of claim 9, wherein the resist is undeveloped during the detecting.

14. The method of claim 9, further comprising determining a performance of the fluid handing structure and one or more associated working parameters based on the detecting.

15. The method of claim 14, further comprising changing one or more of the one or more associated working parameters according to the results of the determining.

16. A method comprising:
first moving a dosage sensor under a fluid handing structure in an immersion lithographic apparatus so that the dosage sensor becomes covered with immersion liquid in order to condition the dosage sensor;
second moving the dosage sensor out from under the fluid handing structure;
allowing at least partial evaporation of any immersion liquid on the dosage sensor so that a cooling load is induced on the dosage sensor;
third moving the dosage sensor under the fluid handing structure;
irradiating in which the dosage sensor is exposed to a radiation beam from the projection system of the immersion lithographic apparatus; and
measuring a response of the dosage sensor to the irradiating and determining the cooling load on the basis that the dose of the irradiating is known and any divergence from the known dose in the measuring is due to a temperature sensitivity of the dosage sensor.

17. The method of claim 16, wherein in the irradiating, the dosage sensor is exposed multiple times and in the measuring, the response of the sensor is measured for each exposure.

18. The method of claim 17, wherein the dosage sensor is exposed multiple times until divergence from the known dose is below a certain magnitude.

19. The method of claim 18, wherein a time taken for the divergence to fall below the certain magnitude is at least partly used in determining the cooling load.

20. The method of claim 16, wherein the first moving, second moving, allowing, third moving, irradiating and measuring are performed multiple times in which successive allowing at least partial evaporation is carried out for different lengths of time.

* * * * *